US012621957B2

(12) United States Patent
Lee et al.

(10) Patent No.: US 12,621,957 B2
(45) Date of Patent: May 5, 2026

(54) FAN CONTROL METHOD AND FAN CONTROL DEVICE FOR CONTROLLING FANS USING A NEURAL NETWORK TO PROCESS CHARACTERISTIC VARIABLES

(71) Applicants: Inventec (Pudong) Technology Corp., Shanghai (CN); Inventec Corporation, Taipei (TW)

(72) Inventors: Chien-Ming Lee, Taipei (TW); Kai-Yang Tung, Taipei (TW); Hsin-Cheng Chu, Taipei (TW)

(73) Assignees: Inventec (Pudong) Technology Corp., Shanghai (CN); Inventec Corporation, Taipei (TW)

( * ) Notice: Subject to any disclaimer, the term of this patent is extended or adjusted under 35 U.S.C. 154(b) by 774 days.

(21) Appl. No.: 18/078,109

(22) Filed: Dec. 9, 2022

(65) Prior Publication Data
US 2023/0403816 A1     Dec. 14, 2023

(30) Foreign Application Priority Data

Jun. 10, 2022    (CN) .......................... 202210658257.0

(51) Int. Cl.
*G06N 3/049* (2023.01)
*G06N 3/08* (2023.01)
*H05K 7/20* (2006.01)

(52) U.S. Cl.
CPC ......... H05K 7/20209 (2013.01); G06N 3/049 (2013.01); G06N 3/08 (2013.01); H05K 7/20136 (2013.01)

(58) Field of Classification Search
CPC .......... H05K 7/20209; H05K 7/20136; H05K 7/20736; G06N 3/049; G06N 3/08; G06N 3/044; G06N 3/0455; F04D 27/00; F04D 27/004
See application file for complete search history.

(56) References Cited

U.S. PATENT DOCUMENTS 12,055,988 B1 * 8/2024 Nikafrooz ............... G06F 1/206
2006/0222045 A1 * 10/2006 Byquist .................. G01K 1/026
374/E7.042

(Continued)

FOREIGN PATENT DOCUMENTS

CN          114442794 A  *  5/2022  ........... G06F 1/3287

*Primary Examiner* — Santosh R Poudel
(74) *Attorney, Agent, or Firm* — Winston Hsu

(57) ABSTRACT

A fan control method for controlling a set of fans of a system includes collecting M first sets of characteristic variables of a first period; inputting the M first sets of characteristic variables to a neural network to generate N third sets of characteristic variables of a second period corresponding to a second set of characteristic variables; adjusting the second set of characteristic variables to generate P adjusted second sets of characteristic variables to accordingly generate Q adjusted third sets of characteristic variables; generating an optimized second set of characteristic variables according to the N third sets of characteristic variables and the Q adjusted third sets of characteristic variables; generating a set of weights according to the optimized second set of characteristic variables; and controlling the set of fans according to the set of weights. The first period precedes the second period. M, N, P, Q are positive integers.

10 Claims, 8 Drawing Sheets

(56)              References Cited

U.S. PATENT DOCUMENTS

| 2012/0016526 | A1* | 1/2012 | Burton | F24F 11/30 |
| | | | | 700/278 |
| 2013/0158738 | A1* | 6/2013 | Chen | G06N 3/09 |
| | | | | 700/300 |
| 2015/0378404 | A1* | 12/2015 | Ogawa | G05B 15/02 |
| | | | | 700/300 |
| 2017/0082112 | A1* | 3/2017 | Barron | H05K 7/20836 |
| 2018/0260007 | A1* | 9/2018 | Ping | G11B 33/142 |
| 2018/0260008 | A1* | 9/2018 | Ping | G05D 23/1919 |

* cited by examiner

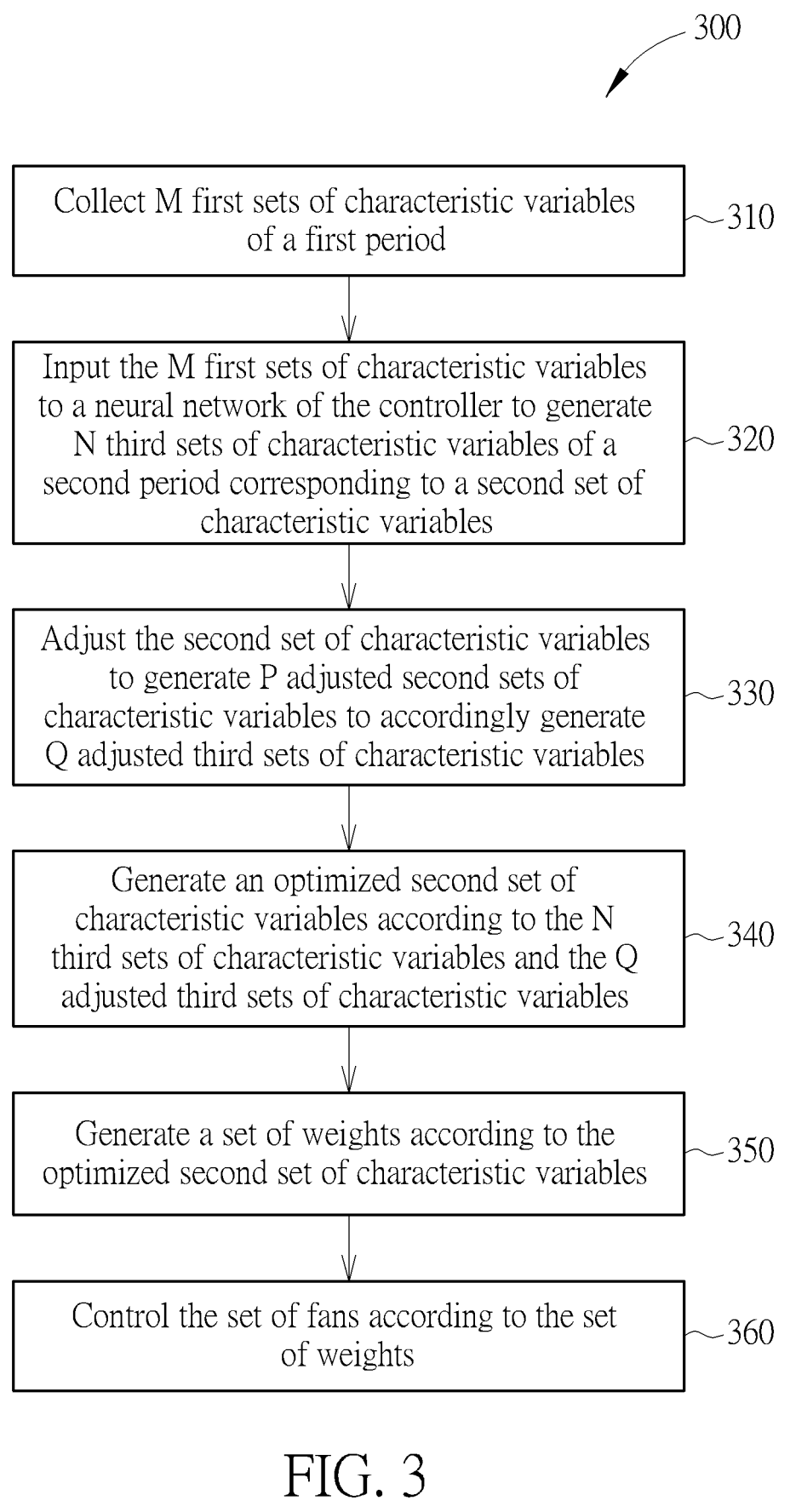

300

Collect M first sets of characteristic variables of a first period — 310

Input the M first sets of characteristic variables to a neural network of the controller to generate N third sets of characteristic variables of a second period corresponding to a second set of characteristic variables — 320

Adjust the second set of characteristic variables to generate P adjusted second sets of characteristic variables to accordingly generate Q adjusted third sets of characteristic variables — 330

Generate an optimized second set of characteristic variables according to the N third sets of characteristic variables and the Q adjusted third sets of characteristic variables — 340

Generate a set of weights according to the optimized second set of characteristic variables — 350

Control the set of fans according to the set of weights — 360

FIG. 3

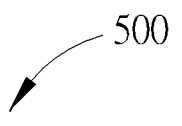

~500

Adjust the second set of characteristic variables to generate the P adjusted second sets of characteristic variables according to a minimum adjustment value of the second set of characteristic variables, so as to accordingly generate the Q adjusted third set of characteristic variables ~510

Generate a set of sums of absolute values according to differences of a predetermined value and each of the N third sets of characteristic variables and the Q adjusted third set of characteristic variables ~520

Generate the optimized second set of characteristic variables according to R third sets of characteristic variables which can be selected from the N third sets of characteristic variables and the Q adjusted third sets of characteristic variables and be corresponding to a smallest sum of absolute values ~530

FIG. 5

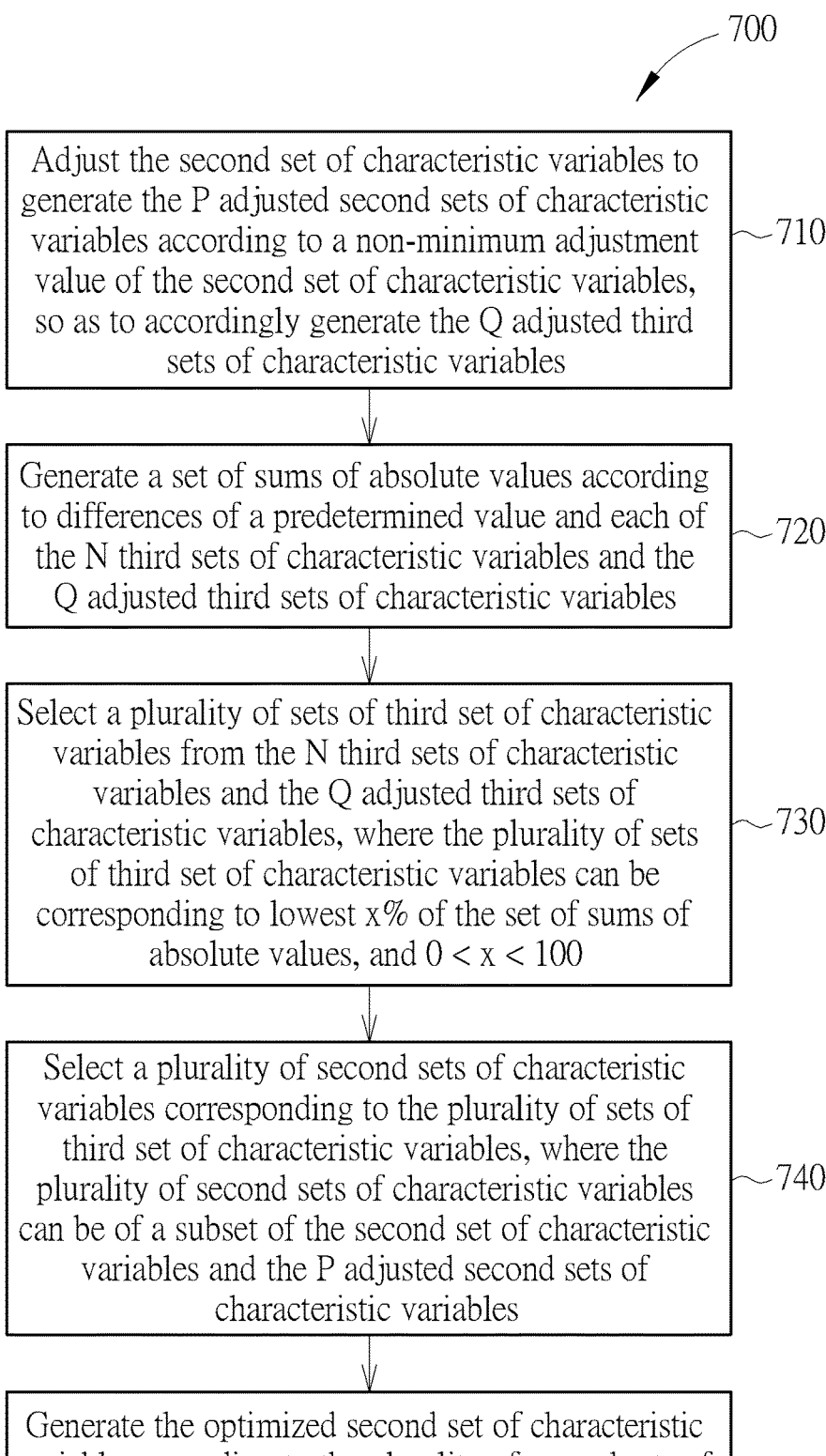

*700*

Adjust the second set of characteristic variables to generate the P adjusted second sets of characteristic variables according to a non-minimum adjustment value of the second set of characteristic variables, so as to accordingly generate the Q adjusted third sets of characteristic variables ~710

Generate a set of sums of absolute values according to differences of a predetermined value and each of the N third sets of characteristic variables and the Q adjusted third sets of characteristic variables ~720

Select a plurality of sets of third set of characteristic variables from the N third sets of characteristic variables and the Q adjusted third sets of characteristic variables, where the plurality of sets of third set of characteristic variables can be corresponding to lowest x% of the set of sums of absolute values, and 0 < x < 100 ~730

Select a plurality of second sets of characteristic variables corresponding to the plurality of sets of third set of characteristic variables, where the plurality of second sets of characteristic variables can be of a subset of the second set of characteristic variables and the P adjusted second sets of characteristic variables ~740

Generate the optimized second set of characteristic variables according to the plurality of second sets of characteristic variables and a minimum adjustment value of the second set of characteristic variables ~750

FIG. 7

FAN CONTROL METHOD AND FAN CONTROL DEVICE FOR CONTROLLING FANS USING A NEURAL NETWORK TO PROCESS CHARACTERISTIC VARIABLES

BACKGROUND OF THE INVENTION

1. Field of the Invention

The disclosure is related to a fan control method and a fan control device, and more particularly, a fan control method and a fan control device for controlling fans using a neural network to process characteristic variables.

2. Description of the Prior Art

Advanced technologies such as artificial Intelligence (AI), cloud service, 5G and 6G communications, and the internet of things (IoT) are driven by many data centers, which includes a large number of servers used for performing related operations, storage and communications. A large number of servers consume a lot of power, so power efficiency is a key factor in designing a server.

For example, each server is usually equipped with 4 to 10 cooling fans, and the fan speed of each fan can be controlled separately. In order to achieve the best cooling effect, the speed of all fans can be turned to the maximum at present. However, this will cause the fan to consume too much energy, resulting in lower power efficiency.

In addition, according to actual observations, it may not obtain the best heat dissipation effect by turning the fan speed to the maximum. The reason is, an excessive air volume may blow the heat energy from one element to another element, which is not conducive to the cooling effect. Therefore, a better solution for improving the performance of controlling fans is still in need in the field.

SUMMARY OF THE INVENTION

An embodiment provides a fan control method for controlling a set of fans of a system. The fan control method includes collecting M first sets of characteristic variables of a first period; inputting the M first sets of characteristic variables to a neural network to generate N third sets of characteristic variables of a second period corresponding to a second set of characteristic variables; adjusting the second set of characteristic variables to generate P adjusted second sets of characteristic variables to accordingly generate Q adjusted third sets of characteristic variables; generating an optimized second set of characteristic variables according to the N third sets of characteristic variables and the Q adjusted third sets of characteristic variables; generating a set of weights according to the optimized second set of characteristic variables; and controlling the set of fans according to the set of weights. The first period precedes the second period, each first set of characteristic variables comprises a second set of characteristic variables and a third set of characteristic variables, M, N, P, Q are positive integers.

Another embodiment provides a fan control device for controlling a set of fans of a system. The fan control device includes a system power load unit configured to control a power load; a set of sensors configured to measure a set of temperatures of the system; a fan speed control unit configured to control fan speeds of the set of fans; and a controller coupled to the system power load unit, the set of sensors and the fan speed control unit. The controller is configured to collect M first sets of characteristic variables of a first period; input the M first sets of characteristic variables to a neural network to generate N third sets of characteristic variables of a second period corresponding to a second set of characteristic variables; adjust the second set of characteristic variables to generate P adjusted second sets of characteristic variables to accordingly generate Q adjusted third sets of characteristic variables; generate an optimized second set of characteristic variables according to the N third sets of characteristic variables and the Q adjusted third sets of characteristic variables; generate a set of weights according to the optimized second set of characteristic variables; and control the set of fans according to the set of weights. The first period precedes the second period, each first set of characteristic variables comprises a second set of characteristic variables and a third set of characteristic variables, each first set of characteristic variables comprises the power load, the set of temperatures and the fan speeds of the set of fans, M, N, P, Q are positive integers.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 3 illustrates a flowchart of the fan control method according to an embodiment.

FIG. 5 illustrates a flowchart for generating the optimized second set of characteristic variables in FIG. 3.

FIG. 7 illustrates another flowchart for generating the optimized second set of characteristic variables in FIG. 3.

DETAILED DESCRIPTION

In order to improve cooling efficiency, weights can be used to control the fan speed. If the system has m temperature sensors and n fans, a two-dimensional matrix with m columns and n rows ($m \times n$) can be set. This two-dimensional matrix can be used to control the fans. The matrix elements in the i-th column and the j-th row can be expressed as $W_{ij}$, where m, n, i, and j are integers, $0 < i \leq m$, and $0 < j \leq n$. The matrix element $W_{ij}$ can be the weight of the i-th temperature measured by the i-th temperature sensor related to the j-th fan, and the matrix element $W_{mn}$ is the weight of the m-th temperature measured by the m-th temperature sensor related to the n-th fan, and so on.

The weight (each of $W_{11}$ to $W_{mn}$) can be a value between 0 and 1. When a weight is greater, the correlation and influence of a temperature on a fan is greater. For example, the influence brought by the temperature measured by the i-th temperature sensor of the system (expressed as Ti) to the speed of the j-th fan can be expressed as u×Wij, where u can be a maximum fan speed generated according to all temperatures measured in the system.

By setting appropriate weights, the fans can be properly controlled to have a better cooling effect. The fan control method and the fan control system provided by embodiments described below can be used to perform machine learning with a neural network to generate appropriate weights.

Figures 1, 2:
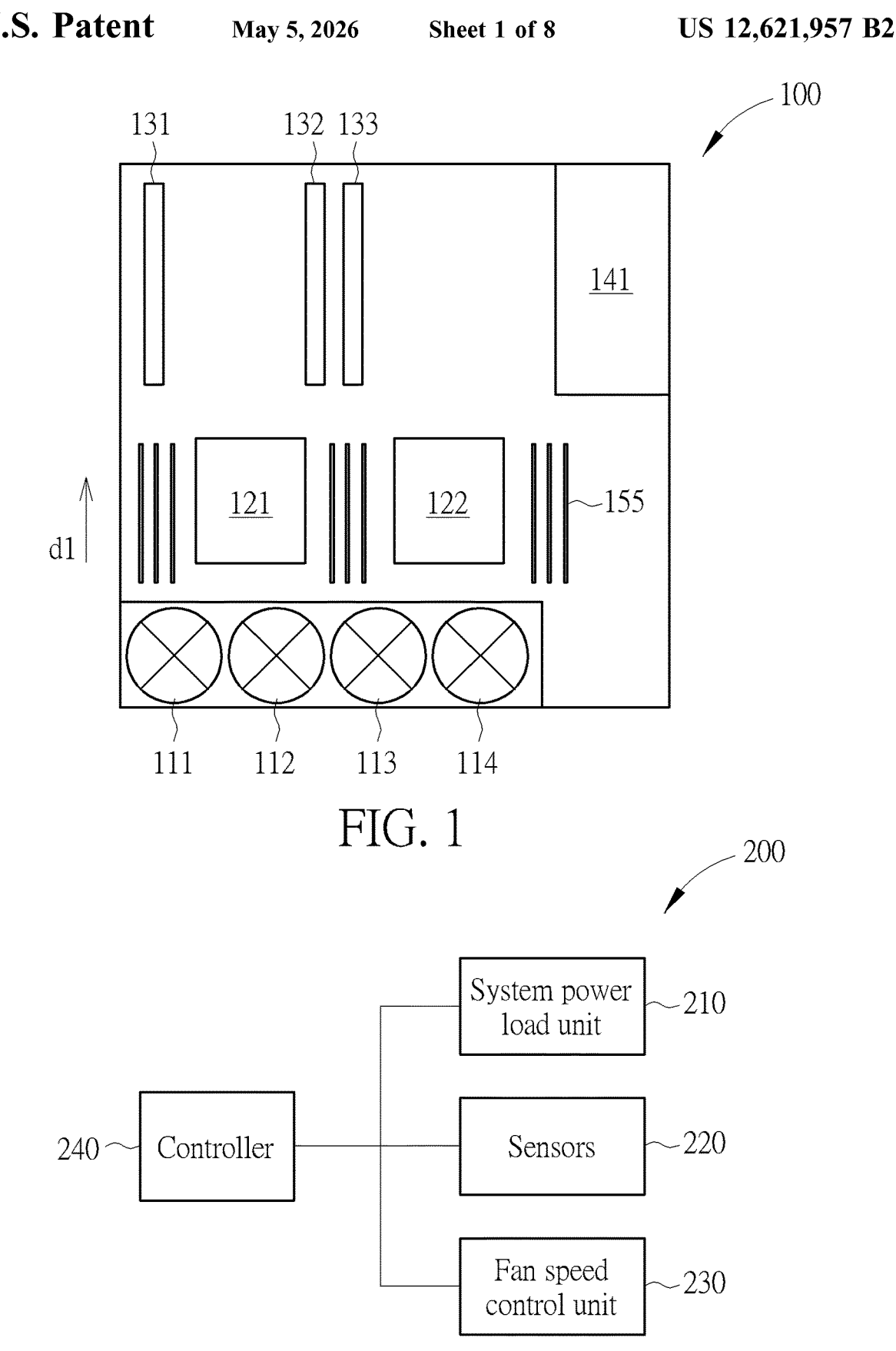
FIG. 1 illustrates a system according to an embodiment.
FIG. 2 illustrates a fan control device according to an embodiment.

FIG. 1 illustrates a system 100 according to an embodiment. The system 100 can be a server including fans 111 to 114, processors 121 to 122, bus cards 131 to 133, a memory 155 and a power supply 141. The bus cards 131 to 133 can be peripheral component interconnect express (PCIe) cards. FIG. 1 is an example, and embodiments are not limited thereto. In FIG. 1, the wind direction of the fans 111 to 114 can be shown as the direction dl. The following characteristic variables X1 to X9 can be input to the neural network to perform machine learning:

X1: a power load of system 100;
X2: a speed of the fan zone Zone1, where the fan zone Zone1 can include fans 111 and 112;
X3: a speed of the fan zone Zone2, where the fan zone Zone2 can include fans 113 and 114;
X4: a temperature of the processor 121;
X5: a temperature of the processor 122;
X6: a temperature of the bus card 131;
X7: a temperature of the bus card 132;
X8: a temperature of bus card 133; and
X9: an inlet temperature of system 100.

The characteristic variables X1 to X9 can be input into a neural network to predict the characteristic variables X6 to X8 (i.e. the temperatures of the bus card 131 to 133) so as to obtain better characteristic variables X2 and X3 (i.e. the fan speeds). A better two-dimensional matrix can be generated accordingly to improve the control of the fans.

FIG. 2 illustrates a fan control device 200 according to an embodiment. The fan control device 200 can be used to control the fans 111 to 114 of the system 100, and include a The mentioned neural network can be set in the controller 240 in FIG. 2. The neural network can include a recurrent neural network (RNN). The numbers of encoding neurons and decoding neurons of the neural network can be 64 & 32, 128 & 64, 256 & 128 or 512 & 256. According to experiments, when the neural network includes 512 encoding neurons and 256 decoding neurons, the prediction is better. The characteristic variables X1 to X9 can be input to the neural network to perform a multistage attention (MSA) algorithm.

Regarding the training data input into the neural network, a plurality of system states can be generated according to the power load (i.e. the characteristic variable X1) and the fan speeds (i.e. characteristic variables X2 and X3). A plurality of pieces of training data can be generated according to the plurality of system states. The neural network can be trained according to the plurality of pieces of training data. For example, it can be shows as following Table 1. Table 1 is an example, and embodiments are not limited thereto. For example, the characteristic variable X1 can be corresponding to 5 power loads (e.g. 25%, 40%, 60%, 80% and 100%), and the characteristic variables X2 and X3 each can be corresponding to 8 fan speeds (e.g. 30%, 40%, 50%, 60%, 70%, 80%, 90% and 100%). As shown in Table 1, when the characteristic variables X2 and X3 are both 100% (i.e. the maximum fan speeds in Table 1), the fans can perform heat dissipation for 5 power loads (i.e. 25%, 40%, 60%, 80% and 100%). In another scenario, when the characteristic variables X2 and X3 are both 30% (i.e. the minimum fan speeds in Table 1), the fans can perform heat dissipation for 2 power loads (i.e. 25% and 40%) since the cooling ability of the fans is weaker in this scenario. Hence, different combination of the characteristic variables X2 and X3 can perform heat dissipation for different number of power load(s).

In Table 1, 272 system states can be obtained by adding up the numbers of power loads which can be cooled down by the combinations of the characteristic variables X2 and X3. If each system state takes 0.5 hours for data collection, training and system recovery, the training time can be 136 hours (i.e. 272×0.5 hours).

TABLE 1

| Number of power loads which can be cooled down | | Characteristic variable X2 (the fan speed of the fan zone Zone1) | | | | | | | |
|---|---|---|---|---|---|---|---|---|---|
| | | 100% | 90% | 80% | 70% | 60% | 50% | 40% | 30% |
| Characteristic | 100% | 5 | 5 | 5 | 5 | 5 | 5 | 4 | 3 |
| variable X3 | 90% | 5 | 5 | 5 | 5 | 5 | 5 | 4 | 3 |
| (the fan speed | 80% | 5 | 5 | 5 | 5 | 5 | 5 | 4 | 3 |
| of the fan | 70% | 5 | 5 | 5 | 5 | 5 | 5 | 4 | 3 |
| zone Zone2) | 60% | 5 | 5 | 5 | 5 | 5 | 5 | 4 | 3 |
| | 50% | 5 | 5 | 5 | 5 | 5 | 4 | 4 | 3 |
| | 40% | 4 | 4 | 4 | 4 | 4 | 3 | 3 | 3 |
| | 30% | 3 | 3 | 3 | 3 | 3 | 3 | 2 | 2 |

A total of 272 system states can be used as training materials.

system power load unit 210, a set of sensors 220, a fan speed control unit 230 and a controller 240. The system power load unit 210 can control the power load (i.e. the characteristic variable X1). The sensors 220 can measure a set of temperatures of the system 100 (i.e. the characteristic variables X4 to X9). The fan speed control unit 230 can control the fan speeds of the fans 111 to 114 (i.e. the characteristic variables X2 and X3). The controller 240 can be coupled to the system power load unit 210, the sensors 220 and the fan speed control unit 230 to perform a fan control method 300 mentioned below.

FIG. 3 illustrates a flowchart of the fan control method 300 according to an embodiment. When the fan control method 300 is performed, the characteristic variables X1 to X9 can be a first set of characteristic variables, the characteristic variables X2 and X3 can be a second set of characteristic variables, and the characteristic variables X6 to X8 can be a third set of characteristic variables. As shown in FIG. 1 to FIG. 4, the fan control method 300 can include the following steps.

Step 310: collect M first sets of characteristic variables X1 to X9 of a first period T1;

Step 320: input the M first sets of characteristic variables X1 to X9 to a neural network of the controller 240 to generate N third sets of characteristic variables X6 to X8 of a second period T2 corresponding to a second set of characteristic variables X2 and X3;

Step 330: adjust the second set of characteristic variables X2 and X3 to generate P adjusted second sets of characteristic variables X2 and X3 to accordingly generate Q adjusted third sets of characteristic variables X6 to X8;

Step 340: generate an optimized second set of characteristic variables X2 and X3 according to the N third sets of characteristic variables X6 to X8 and the Q adjusted third sets of characteristic variables X6 to X8;

Step 350: generate a set of weights according to the optimized second set of characteristic variables X2 and X3; and Step 360: control the set of fans (e.g. the fans 111 to 114) according to the set of weights.

In FIG. 3, M, N, P, Q are positive integers. In FIG. 3, the first set of characteristic variables X1 to X9 can include the power load X1 of the system 100, the fan speeds X2 and X3, and the first set of temperatures X4 to X9 generated by measuring the system 100. The second set of characteristic variables can include the fan speeds X2 and X3. The third set of characteristic variables can include a second set of temperatures X6 to X8 generated by measuring the system 100. Hence, a first set of characteristic variables (i.e. X1 to X9) can include a second set of characteristic variables (i.e. X2 and X3) and a third set of characteristic variables (i.e. X6 to X8). According to an embodiment, the first period T1 can precede the second period T2.

Figure 4:
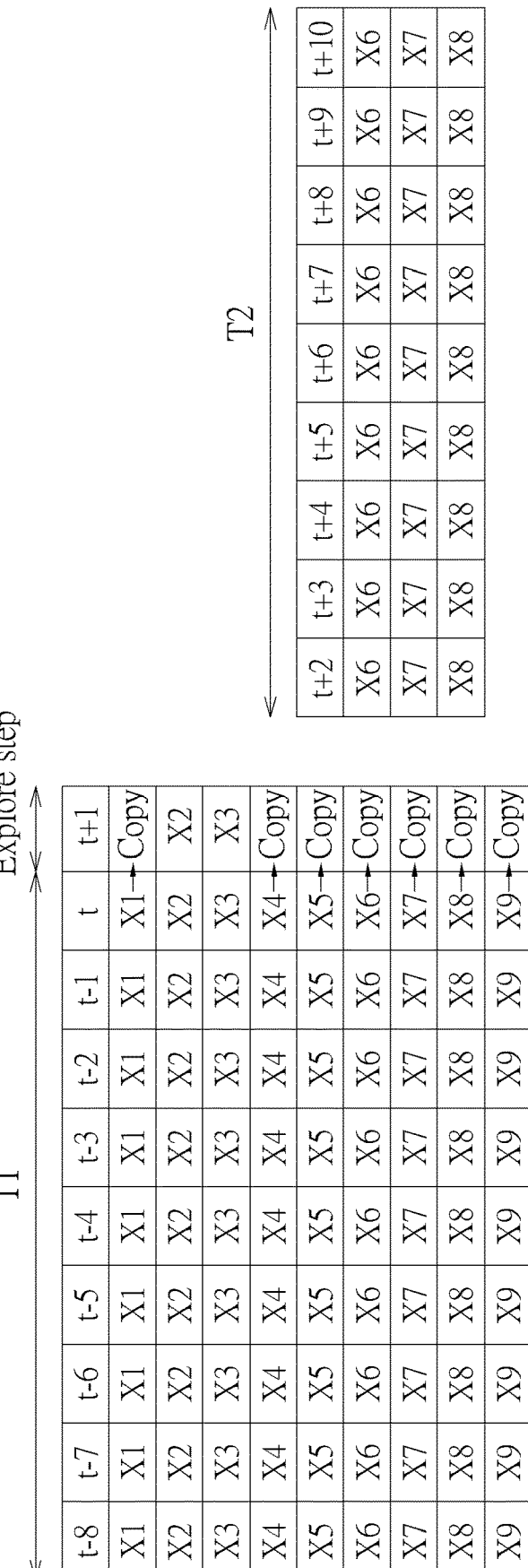
FIG. 4 illustrates the characteristic variables mentioned in FIG. 3 corresponding to different times according to an embodiment.

FIG. 4 illustrates the characteristic variables mentioned in FIG. 3 corresponding to different times according to an embodiment. FIG. 4 is an example, and embodiments are not limited thereto. In FIG. 4, times (t−8) to (t+10) are different times. The time (t−1) can be a time before the time t, the time t can be a time before the time (t+1), and so on. The times (t−8) to (t−1) can be times of the past, the time t can be a current time, and the times (t+1) to (t+8) can be times of the future. In FIG. 4, the times (t−8) to t can be corresponding to the period T1, and the times (t+2) to (t+8) can be corresponding to the period T2.

As mentioned in Steps 310 and 320, the characteristic variables X1 to X9 collected in the period T1 can be used to estimate the characteristic variables X6 to X8 (e.g. the temperatures of the bus cards 131 to 133) in the period T2 using the neural network of the controller 240.

In Step 330, an explore step can be performed at the time (t+1). At the time (t+1), the characteristic variables X1 and X4 to X9 of the time t can be copied, and the characteristic variables X2 and X3 (e.g. fan speeds of the fan zones Zone1 and Zone 2) can be adjusted to generate a plurality of adjusted third sets of characteristic variables X6 to X8.

For example, if each fan of the system 100 can generate 201 fan speeds from a 0th speed (minimum speed) to a 200th speed (maximum speed) according to the pulse width modulation (PWM), there can be 40401 (i.e. 201×201) combinations of the characteristic variables X2 and X3 when the characteristic variables X2 and X3 are adjusted. Hence, in Steps 320 and 330, 40401 combinations of the characteristic variables X6 to X8 of the period T2 can be generated.

In Step 340, the N third sets of characteristic variables X6 to X8 and the Q adjusted third sets of characteristic variables X6 to X8 (e.g. the abovementioned 40401 sets of the characteristic variables X6 to X8) can be used to generate the optimized second set of characteristic variables X2 and X3 (i.e. the fan speeds). Details of generating the optimized second set of characteristic variables X2 and X3 according to the estimated characteristic variables X6 to X8 will be described below.

In Steps 350 and 360, the weights (e.g. the matrix elements W11 to Wmn) can be generated according to the optimized second set of characteristic variables X2 and X3, be used to control the fans in the system 100.

FIG. 5 illustrates a flowchart for generating the optimized second set of characteristic variables X2 and X3 in Steps 330 and 340 of FIG. 3. In FIG. 5, the following steps can be performed. Step 510 can be related to Step 330, and Step 520 to 530 can be related to Step 340.

Step 510: adjust the second set of characteristic variables X2 and X3 to generate the P adjusted second sets of characteristic variables according to a minimum adjustment value of the second set of characteristic variables X2 and X3, so as to accordingly generate the Q adjusted third set of characteristic variables X6 to X8;

Step 520: generate a set of sums of absolute values according to differences of a predetermined value PV and each of the N third sets of characteristic variables X6 to X8 and the Q adjusted third set of characteristic variables X6 to X8; and Step 530: generate the optimized second set of characteristic variables X2 and X3 according to R third sets of characteristic variables X6 to X8 which can be selected from the N third sets of characteristic variables X6 to X8 and the Q adjusted third sets of characteristic variables X6 to X8 and be corresponding to a smallest sum of absolute values.

In FIG. 5, R is a positive integer. In Step 510, the minimum adjustment value can be the smallest adjustable range of the fan speed. For example, if the fan speed can be adjusted from a 0th fan speed to a 200th speed, the P adjusted second sets of characteristic variables X2 and X3 in Step 510 can include (201×201−1) combinations, and (201× 201−1) is the largest number of the possible combinations.

Figure 6:
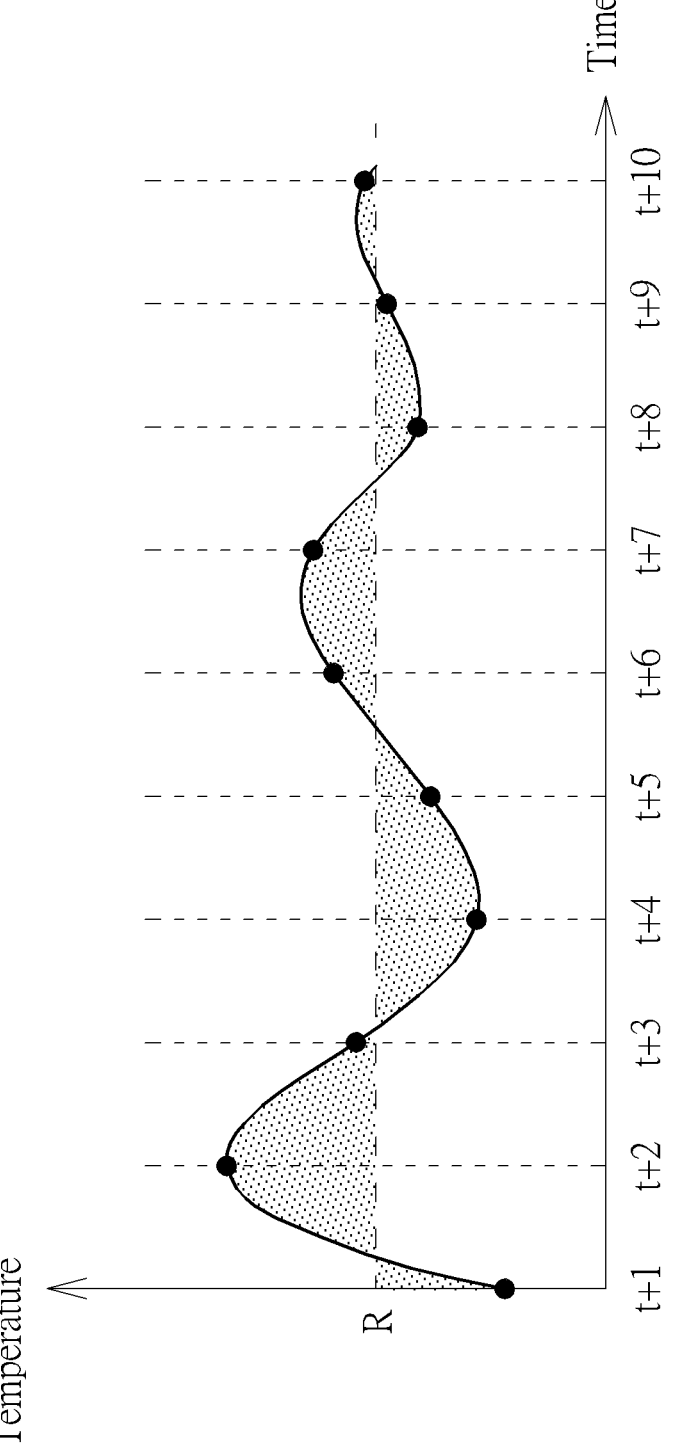
FIG. 6 illustrates an example of temperatures of a bus card estimated by a neural network.

Below, Steps 510 and 520 in FIG. 5 are explained in detail with reference to FIG. 6. FIG. 6 is an example, and embodiments are not limited thereto. FIG. 6 illustrates temperatures of a bus card at the times (t+1) to (t+10) estimated by a neural network. The vertical axis of FIG. 6 represents temperature T of the bus card (e.g. an average or a weighted average or one of the characteristic variable X6 to X8). The horizontal axis represents time. The predetermined value PV in FIG. 6 can be a preset "setpoint" temperature of the factory specification of the bus card. Since the goal of temperature control is to make the temperature of the bus card as close to the setpoint temperature as possible, a smaller shadowed area represents better distributions of the characteristic variables X6 to X8. After obtaining an optimized distribution of the characteristic variables X6 to X8, the characteristic variables X2 and X3 corresponding the characteristic variables X6 to X8 with the optimized distribution is the optimized characteristic variables X2 and X3 generated in Step 530.

Regarding FIG. 6, an equation cost F can be used to obtain the area of the colored part, and it can be expressed as the equation eq-1:

cost $F=\Sigma$(area between the curve and the a predetermined value PV)　　　　eq-1.

For the convenience of calculation, the equation eq-1 can be adjusted to be the equation eq-2:

$$\text{cost } F = \sum_{i=1}^{10} |R - T(t+i)|. \qquad \text{eq-2}$$

In the equation eq-2, T(t+i) can be the temperature T of the bus card at the time (t+1) on the curve in FIG. 6. As shown in FIG. 6, the sum of the absolute values of the differences of the predetermined value PV and the temperatures T(t+i) to T(t+10) can be calculated. A temperature distribution for generating the minimum sum of absolute values can be corresponding to the optimized characteristic values X6 to X8. As shown in FIG. 4, the characteristic values X2 and X3 in the explore step (e.g. at the time (t+1)) used for generating the optimized characteristic values X6 to X8 can be the optimized characteristic values X2 and X3 in Step 530.

The flow in FIG. 5 and FIG. 6 can be a "greedy explore" flow. The flow of Steps 510 to 530 is usable, however, it may be difficult to reduce the amount of calculation. The reason is, the number of the combinations of the characteristic values X2 and X3 may be large when the characteristic values X2 and X3 are adjusted using the minimum adjustment value in Step 510. In the abovementioned example, the numbers of the characteristic values X2 and X3 can be 201 and 201, so there can be 40401 combinations. In Steps 520 and 530, the amount of calculation is quite large if 40401 combinations of the characteristic values X2 and X3 are analyzed and compared.

For reducing the amount of calculation, 2-stage greedy explore flow can be used, as shown in FIG. 7. FIG. 7 illustrates a flowchart for generating the optimized second set of characteristic variables X2 and X3 in Steps 330 and 340 of FIG. 3. In FIG. 7, the following steps can be performed. Step 710 can be related to Step 330, and Step 720 to 750 can be related to Step 340.

Step 710: adjust the second set of characteristic variables X2 and X3 to generate the P adjusted second sets of characteristic variables X2 and X3 according to a non-minimum adjustment value of the second set of characteristic variables X2 and X3, so as to accordingly generate the Q adjusted third sets of characteristic variables X6 to X8;

Step 720: generate a set of sums of absolute values according to differences of a predetermined value PV and each of the N third sets of characteristic variables X6 to X8 and the Q adjusted third sets of characteristic variables X6 to X8;

Step 730: select a plurality of sets of third set of characteristic variables from the N third sets of characteristic variables X6 to X8 and the Q adjusted third sets of characteristic variables X6 to X8, where the plurality of sets of third set of characteristic variables X6 to X8 can be corresponding to lowest x % of the set of sums of absolute values, and 0<x<100;

Step 740: select a plurality of second sets of characteristic variables X2 and X3 corresponding to the plurality of sets of third set of characteristic variables X6 to X8, where the plurality of second sets of characteristic variables X2 and X3 can be of a subset of the second set of characteristic variables X2 and X3 and the P adjusted second sets of characteristic variables X2 and X3; and Step 750: generate the optimized second set of characteristic variables X2 and X3 according to the plurality of second sets of characteristic variables X2 and X3 and a minimum adjustment value of the second set of characteristic variables X2 and X3.

Step 710 can be similar to Step 510. However, for reducing the amount of calculation, the non-minimum adjustment value can be used to adjust the characteristic values X2 and X3. For example, if each of the characteristic values X2 and X3 has 201 fan speeds corresponding to different duty cycles of PWM, there can be 40401 combinations. In Step 710, when the characteristic values X2 and X3 are adjusted, 4 units instead of 1 unit can be used to adjust the PWM, so as to decrease the number of the combinations of the fan speeds.

Here, Step 510 is compared with Step 710. In Step 510, when adjusting the characteristic variable X2, the related pulse widths can be 0 units, 1 unit, 2 units . . . or 200 units, so there can be 201 kinds of pulse widths. In Step 710, when adjusting the characteristic variable X2, the related pulse widths can be 0 units, 4 units, 8 units . . . or 200 units, so there can be 51 kinds of pulse widths. Hence, in Step 710, the number of the combinations of the characteristic variables X2 and X3 can be reduced from 40401 (i.e. $201^2$) to 2601 (i.e. $51^2$).

Steps 720 and 730 can be similar to Steps 520 and 530. For example, in the way of FIG. 6 and the equations eq-1 and eq-2, a better distribution of the characteristic variables X6 to X8 can be obtained. However, in Step 730, multiple sets of characteristic variables X6 to X8 corresponding to lowest x % of the sums of absolute values can be selected instead of selecting the characteristic variables X6 to X8 corresponding to a smallest sum of absolute values. For example, if 2601 (i.e. $51^2$) sums of absolute values are generated in Steps 710 and 720, and x=1, the characteristic variables X2 and X3 corresponding to lowest 1% of the sums of absolute values can be selected in Step 740; in other words, 26 sets of characteristic variables X2 and X3 can be selected.

In Step 750, the characteristic variables X2 and X3 selected in Step 740 (e.g. the abovementioned 26 sets of characteristic variables X2 and X3) can be anchor points. The characteristic variables X2 and X3 can be adjusted with the minimum adjustment value (e.g. a smallest unit for adjusting the pulse width of PWM) so as to estimate the characteristic variables X6 to X8. Then, the method of FIG. 6 and the equations eq-1 and eq-2 can be used to generate the optimized second set of characteristic variables X2 and X3.

Figure 8:
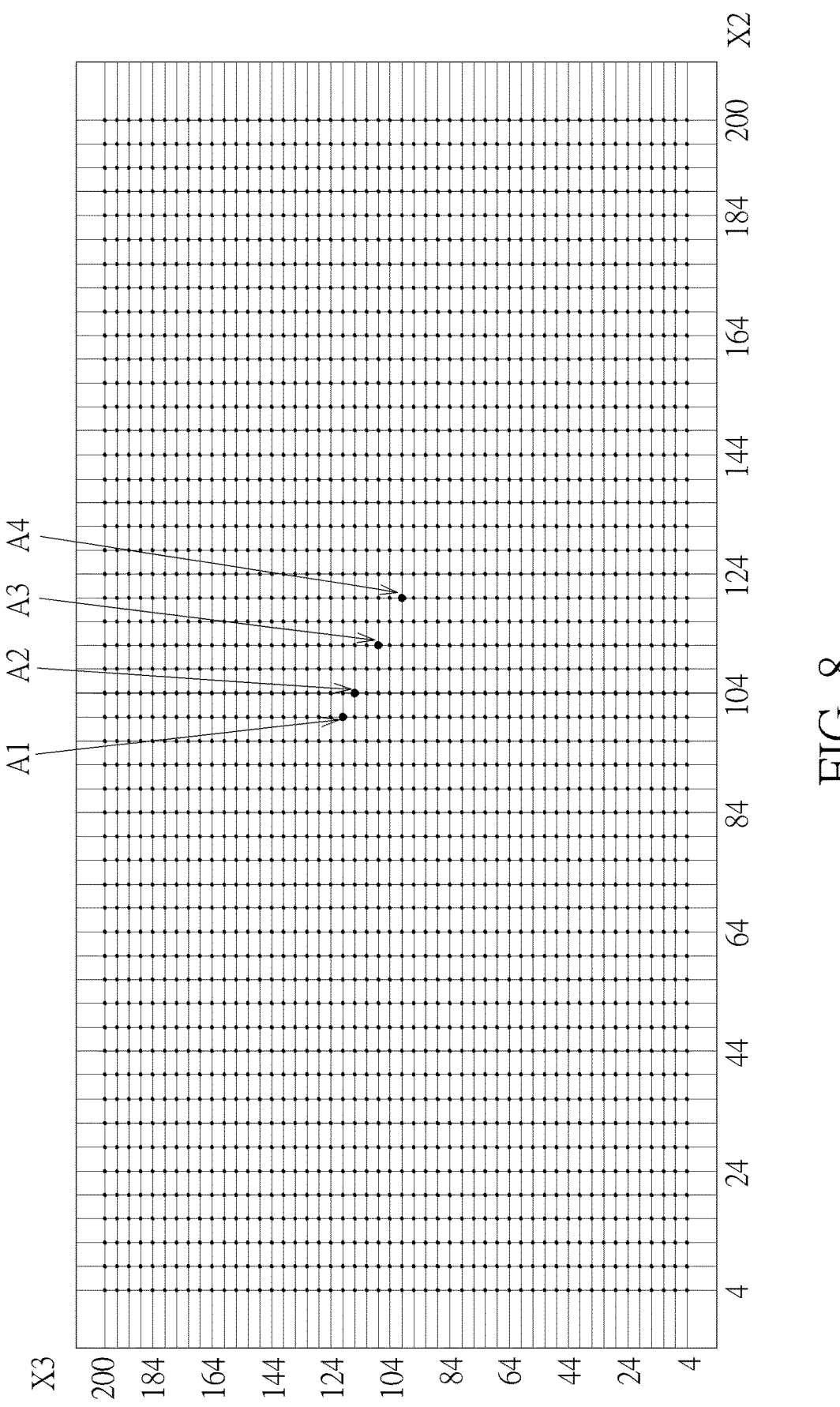
FIG. 8 illustrates anchor points are selected from a plurality of adjusted second sets of characteristic variables according to a non-minimum adjustment value according to the flow in FIG. 7.
Figure 9:
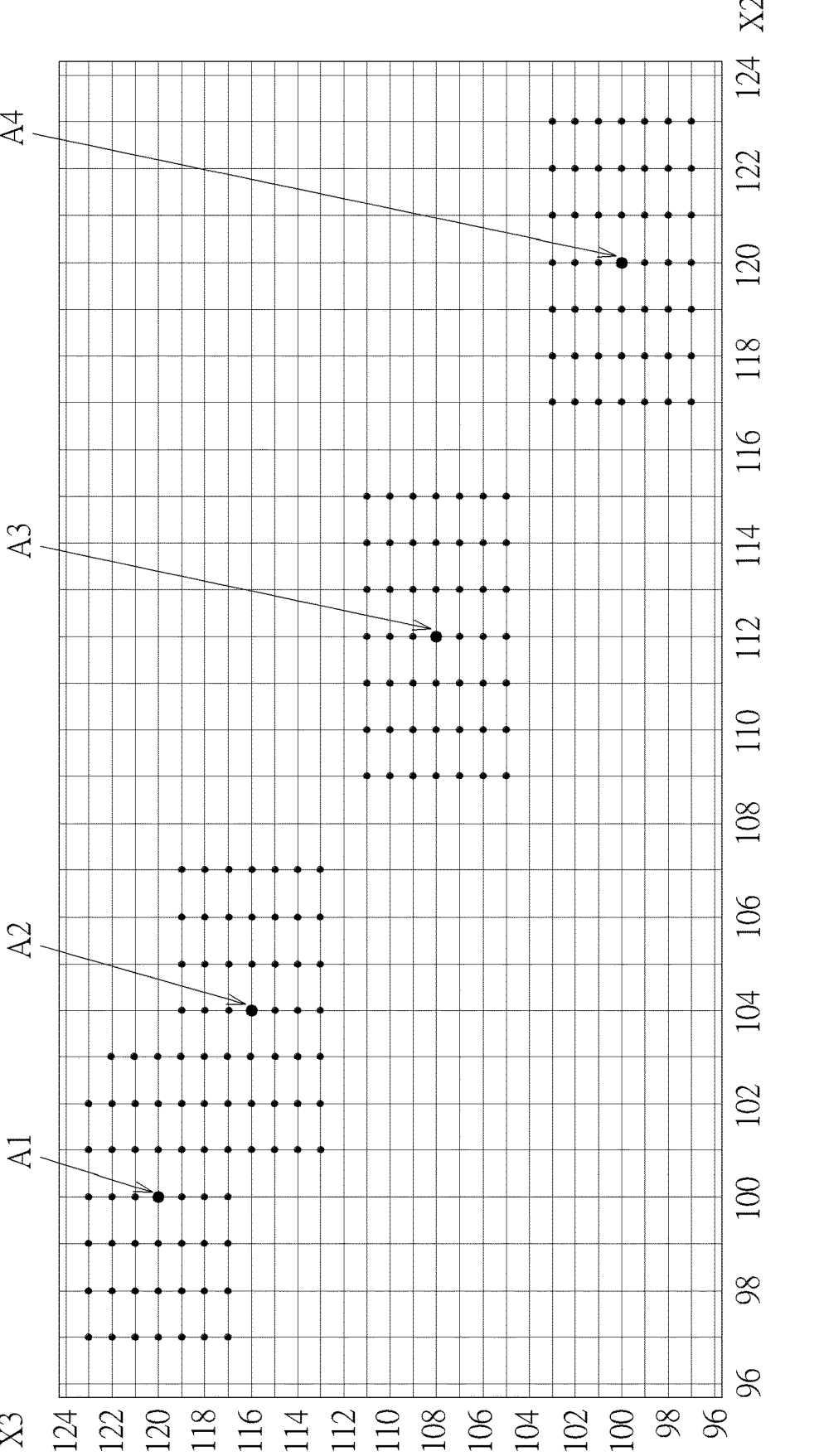
FIG. 9 illustrates the optimized second set of characteristic variables is selected according to the anchor points and a minimum adjustment value according to the flow in FIG. 7.

FIG. 8 and FIG. 9 illustrate an example for describing the flow in FIG. 7. FIG. 8 and FIG. 9 are of an example, and embodiments are not limited thereto. In FIG. 8, Steps 710 to 740 can be performed to generate multiple adjusted sets of characteristic variables X2 and X3 according to the non-minimum adjustment value of the characteristic variables X2 and X3 so as to select anchor points A1 to A4. In FIG. 9, Step 750 can be performed to select the optimized characteristic variables X2 and X3 according to the anchor points and the minimum adjustment value of the characteristic variables X2 and X3.

In FIG. 8, the horizontal axis represents the characteristic variable X2 (i.e. the fan speed of the fan zone Zone1), and the vertical axis represents the characteristic variable X3 (i.e. the fan speed of the fan zone Zone2). Since the characteristic variables X2 and X3 can increase by 4 units (i.e. non-minimum adjustment value) of the PWM instead of 1 unit (i.e. minimum adjustment value) in the horizontal axis and the vertical axis of FIG. 8, 2601 combinations instead of 40401 combinations can be generated, and the amount of calculation can hence be reduced. In FIG. 8, according to Steps 730 and 740, by adjusting the x value, a plurality of combinations of the characteristic variables X2 and X3 can be selected. For example, the anchor points A1 to A4 in FIG. 8 can be determined.

In FIG. 9, as described in Step 750, according to the anchor points A1 to A4 and the minimum adjustment value of the characteristic variables X2 and X3 (e.g. 1 unit of the PWM), a plurality of combinations of the characteristic variables X2 and X3 (e.g. 49 combinations) can be generated, where the combinations of the characteristic variables X2 and X3 can be corresponding to multiple points (e.g. 49 points related to each anchor point) located above, below, left of and right of each of the anchor points A1 to A4. Then, the flow in FIG. 5 can be performed to select the optimized characteristic variables X2 and X3 from the multiple combinations of the characteristic variables X2 and X3 corresponding to the multiple points in FIG. 9.

According to embodiments, the server can be used for artificial intelligence (AI) related calculations, edge computing, 5G communications server, cloud server and/or internet of vehicles (IoV) server.

In summary, by using the fan control system 200 and the fan control method 300 provided by embodiments, the heat dissipation performance of the fan can be improved, and the excessive power consumption of the fan can also be reduced. The fan control system 200 and the fan control method 300 can also help applications such as artificial intelligence, 5G communications, 6G communications, edge computing, machine learning, internet of vehicles, internet of things, and cloud services.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A fan control method for controlling a set of fans of a system, comprising:

collecting M first sets of characteristic variables of a first period;

inputting the M first sets of characteristic variables to a neural network to generate N third sets of characteristic variables of a second period corresponding to a second set of characteristic variables;

adjusting the second set of characteristic variables to generate P adjusted second sets of characteristic variables according to a non-minimum adjustment value of the second set of characteristic variables, so as to accordingly generate Q adjusted third sets of characteristic variables;

generating an optimized second set of characteristic variables according to the N third sets of characteristic variables and the Q adjusted third sets of characteristic variables, wherein generating the optimized second set of characteristic variables comprises:

generating a set of sums of absolute values according to differences of a predetermined value and each third set of characteristic variables of the N third sets of characteristic variables and the Q adjusted third sets of characteristic variables;

selecting a plurality of sets of third set of characteristic variables from the N third sets of characteristic variables and the Q adjusted third sets of characteristic variables; and selecting a plurality of second sets of characteristic variables corresponding to the plurality of sets of third set of characteristic variables, wherein the plurality of second sets of characteristic variables are of a subset of the second set of characteristic variables and the P adjusted second sets of characteristic variables; and generating the optimized second set of characteristic variables according to at least the plurality of second sets of characteristic variables;

generating a set of weights according to the optimized second set of characteristic variables; and controlling the set of fans according to the set of weights;

wherein the first period precedes the second period, each first set of characteristic variables comprises a second set of characteristic variables and a third set of characteristic variables, M, N, P, Q are positive integers.

2. The fan control method of claim 1, wherein:

each first set of characteristic variables comprises a power load of the system, fan speeds of the set of fans, and a first set of temperatures generated by measuring the system;

each second set of characteristic variables comprises the fan speeds of the set of fans;

each third set of characteristic variables comprises a second set of temperatures generated by measuring the system; and the first set of temperatures comprises the second set of temperatures.

3. The fan control method of claim 1, wherein the first period and the second period are equal in length.

4. The fan control method of claim 1, wherein:

the plurality of sets of third set of characteristic variables are corresponding to lowest x % of the set of sums of absolute values, and 0<x<100; and generating the optimized second set of characteristic variables according to at least the plurality of second sets of characteristic variables comprises:

generating the optimized second set of characteristic variables according to the plurality of second sets of characteristic variables and a minimum adjustment value of the second set of characteristic variables.

5. The fan control method of claim 1, wherein the neural network comprises 512 encoding neurons and 256 decoding neurons.

6. The fan control method of claim 1, wherein each first set of characteristic variables comprises a set of temperatures generated by measuring the system, and the set of temperatures comprises a first processor temperature, a second processor temperature, a first bus card temperature, a second bus card temperature, a third bus card temperature and an inlet temperature.

7. The fan control method of claim 1, wherein the M first sets of characteristic variables are inputted into the neural network to perform a multistage attention (MSA) algorithm.

8. The fan control method of claim 1, wherein each first set of characteristic variables comprises a power load of the system, fan speeds of the set of fans, and a first set of temperatures generated by measuring the system, and the fan control method further comprises:

generating a plurality of system states according to the power load and the fan speeds of the set of fans;

generating a plurality of pieces of training data according to the plurality of system states; and training the neural network according to the plurality of pieces of training data.

9. A fan control method for controlling a set of fans of a system, comprising:

collecting M first sets of characteristic variables of a first period;

inputting the M first sets of characteristic variables to a neural network to generate N third sets of characteristic variables of a second period corresponding to a second set of characteristic variables;

adjusting the second set of characteristic variables to generate P adjusted second sets of characteristic variables to accordingly generate Q adjusted third sets of characteristic variables;

generating an optimized second set of characteristic variables according to the N third sets of characteristic variables and the Q adjusted third sets of characteristic variables;

generating a set of weights according to the optimized second set of characteristic variables; and controlling the set of fans according to the set of weights;

wherein the first period precedes the second period, each first set of characteristic variables comprises a second set of characteristic variables and a third set of characteristic variables, M, N, P, Q are positive integers;

wherein:

adjusting the second set of characteristic variables to generate the P adjusted second sets of characteristic variables to accordingly generate the Q adjusted third sets of characteristic variables comprises:

adjusting the second set of characteristic variables to generate the P adjusted second sets of characteristic variables according to a minimum adjustment value of the second set of characteristic variables, so as to accordingly generate the Q adjusted third set of characteristic variables; and generating the optimized second set of characteristic variables according to the N third sets of characteristic variables and the Q adjusted third sets of characteristic variables comprises:

generating a set of sums of absolute values according to differences of a predetermined value and each third set of characteristic variables of the N third sets of characteristic variables and the Q adjusted third set of characteristic variables; and generating the optimized second set of characteristic variables according to R third sets of characteristic variables which are selected from the N third sets of characteristic variables and the Q adjusted third sets of characteristic variables and are corresponding to a smallest sum of absolute values;

wherein R is a positive integer.

10. A fan control device for controlling a set of fans of a system, comprising:

a set of sensors configured to measure a set of temperatures of the system;

a fan speed control unit configured to control fan speeds of the set of fans using pulse width modulation; and a controller coupled to the set of sensors and the fan speed control unit, and configured to:

collect M first sets of characteristic variables of a first period;

input the M first sets of characteristic variables to a neural network to generate N third sets of characteristic variables of a second period corresponding to a second set of characteristic variables;

adjust the second set of characteristic variables to generate P adjusted second sets of characteristic variables according to a non-minimum adjustment value of the second set of characteristic variables, so as to accordingly generate Q adjusted third sets of characteristic variables;

generate an optimized second set of characteristic variables according to the N third sets of characteristic variables and the Q adjusted third sets of characteristic variables;

generate a set of weights according to the optimized second set of characteristic variables; and control the set of fans according to the set of weights;

wherein the first period precedes the second period, each first set of characteristic variables comprises a second set of characteristic variables and a third set of characteristic variables, each first set of characteristic variables comprises a power load of the system, the set of temperatures and the fan speeds of the set of fans, M, N, P, Q are positive integers;

generating the optimized second set of characteristic variables comprises:

generating a set of sums of absolute values according to differences of a predetermined value and each third set of characteristic variables of the N third sets of characteristic variables and the Q adjusted third sets of characteristic variables;

selecting a plurality of sets of third set of characteristic variables from the N third sets of characteristic variables and the Q adjusted third sets of characteristic variables; and selecting a plurality of second sets of characteristic variables corresponding to the plurality of sets of third set of characteristic variables, wherein the plurality of second sets of characteristic variables are of a subset of the second set of characteristic variables and the P adjusted second sets of characteristic variables; and generating the optimized second set of characteristic variables according to at least the plurality of second sets of characteristic variables.

* * * * *